United States Patent
Taira et al.

(10) Patent No.: US 7,124,344 B2
(45) Date of Patent: Oct. 17, 2006

(54) ERROR CORRECTION CODING AND DECODING APPARATUSES

(75) Inventors: Shigeki Taira, Tokyo (JP); Takeshi Maeda, Tokyo (JP); Harukazu Miyamoto, Tokyo (JP); Yukari Katayama, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 583 days.

(21) Appl. No.: 09/965,955

(22) Filed: Sep. 27, 2001

(65) Prior Publication Data

US 2002/0078415 A1 Jun. 20, 2002

(30) Foreign Application Priority Data

Sep. 29, 2000 (JP) ............................. 2000-302833

(51) Int. Cl.
*H03M 13/29* (2006.01)
(52) U.S. Cl. .................. 714/755; 369/275.3; 714/769
(58) Field of Classification Search ............... 714/755, 714/762, 769; 369/275.3
See application file for complete search history.

(56) References Cited

U.S. PATENT DOCUMENTS

| | | | | |
|---|---|---|---|---|
| 4,912,695 A | * | 3/1990 | Senshu | 714/766 |
| 5,311,522 A | * | 5/1994 | Murakami | 714/755 |
| 5,559,813 A | * | 9/1996 | Shimizu | 714/755 |
| 6,125,100 A | * | 9/2000 | Sensyu | 369/275.3 |
| 6,311,304 B1 | * | 10/2001 | Kwon | 714/755 |
| 6,539,512 B1 | * | 3/2003 | Jeong et al. | 714/752 |
| 6,567,951 B1 | * | 5/2003 | Senshu | 714/769 |
| 6,661,758 B1 | * | 12/2003 | Sako et al. | 369/53.35 |
| 6,718,510 B1 | * | 4/2004 | Kojima | 714/784 |

FOREIGN PATENT DOCUMENTS

JP A-8-125548 5/1996

OTHER PUBLICATIONS

W. Wesley Peterson and E. J. Weldon, Jr., *Error-Correcting Codes*, 2nd ed., The MIT Press, Cambridge, 1972, pp. 130-137.

* cited by examiner

*Primary Examiner*—Stephen M. Baker
(74) *Attorney, Agent, or Firm*—Townsend and Townsend and Crew LLP

(57) ABSTRACT

A data allocator allocates (N×kV×kH)-byte source data distributively in N (kV bytes×kH bytes) tw0-dimensional arrays and sends the data to a V coder and an H coder. The V coder codes each column of the tow-dimensional arrays according to an (nV, kV) code V, and the H coder codes each row of the two-dimensional arrays according to an (nH, kH) code H. The V and H coders send redundant data to a data allocator. The data allocator allocates the redundant data in a memory to obtain N (nV bytes×nH bytes) product-code codewords and outpouts each row of the product-code codewords in an alternating manner for the N product-code codewords.

8 Claims, 16 Drawing Sheets

FIG. 8

RECORDING (TRANSMITTING) SEQUENCE →

| D[0][0] | D[0][1] | ..... | D[0][171] | H1[0][0] | H1[0][1] | ... | H1[0][9] | D[1][0] | D[1][1] | ..... | D[1][171] | H2[0][0] | H2[0][1] | ... | H2[0][9] |
|---|---|---|---|---|---|---|---|---|---|---|---|---|---|---|---|
| D[0][172] | D[0][173] | ..... | D[0][343] | H1[1][0] | H1[1][1] | ... | H1[1][9] | D[1][172] | D[1][173] | ..... | D[1][343] | H2[1][0] | H2[1][1] | ... | H2[1][9] |
| ⋮ | ⋮ | | ⋮ | ⋮ | ⋮ | | ⋮ | ⋮ | ⋮ | | ⋮ | ⋮ | ⋮ | | ⋮ |
| D[0][1892] | D[0][1893] | ..... | D[0][2063] | H1[11][0] | H1[11][1] | ... | H1[11][9] | D[1][1892] | D[1][1893] | ..... | D[1][2063] | H2[11][0] | H2[11][1] | ... | H2[11][9] |
| D[2][0] | D[2][1] | ..... | D[2][171] | H1[12][0] | H1[12][1] | ... | H1[12][9] | D[3][0] | D[3][1] | ..... | D[3][171] | H2[12][0] | H2[12][1] | ... | H2[12][9] |
| D[2][172] | D[2][173] | ..... | D[2][343] | H1[13][0] | H1[13][1] | ... | H1[13][9] | D[3][172] | D[3][173] | ..... | D[3][343] | H2[13][0] | H2[13][1] | ... | H2[13][9] |
| ⋮ | ⋮ | | ⋮ | ⋮ | ⋮ | | ⋮ | ⋮ | ⋮ | | ⋮ | ⋮ | ⋮ | | ⋮ |
| D[2][1892] | D[2][1893] | ..... | D[2][2063] | H1[23][0] | H1[23][1] | ... | H1[23][9] | D[3][1892] | D[3][1893] | ..... | D[3][2063] | H2[23][0] | H2[23][1] | ... | H2[23][9] |
| ⋮ | ⋮ | | ⋮ | ⋮ | ⋮ | | ⋮ | ⋮ | ⋮ | | ⋮ | ⋮ | ⋮ | | ⋮ |
| D[30][0] | D[30][1] | ..... | D[30][171] | H1[180][0] | H1[180][1] | ... | H1[180][9] | D[31][0] | D[31][1] | ..... | D[31][171] | H2[180][0] | H2[180][1] | ... | H2[180][9] |
| D[30][172] | D[30][173] | ..... | D[30][343] | H1[181][0] | H1[181][1] | ... | H1[181][9] | D[31][172] | D[31][173] | ..... | D[31][343] | H2[181][0] | H2[181][1] | ... | H2[181][9] |
| ⋮ | ⋮ | | ⋮ | ⋮ | ⋮ | | ⋮ | ⋮ | ⋮ | | ⋮ | ⋮ | ⋮ | | ⋮ |
| D[30][1892] | D[30][1893] | ..... | D[30][2063] | H1[191][0] | H1[191][1] | ... | H1[191][9] | D[31][1892] | D[31][1893] | ..... | D[31][2063] | H2[191][0] | H2[191][1] | ... | H2[191][9] |
| V1[0][0] | V1[1][0] | ..... | V1[171][0] | X1[0][0] | X1[0][1] | ... | X1[0][9] | V2[0][0] | V2[1][0] | ..... | V2[171][0] | X2[0][0] | X2[0][1] | ... | X2[0][9] |
| V1[0][1] | V1[1][1] | ..... | V1[171][1] | X1[1][0] | X1[1][1] | ... | X1[1][9] | V2[0][1] | V2[1][1] | ..... | V2[171][1] | X2[1][0] | X2[1][1] | ... | X2[1][9] |
| ⋮ | ⋮ | | ⋮ | ⋮ | ⋮ | | ⋮ | ⋮ | ⋮ | | ⋮ | ⋮ | ⋮ | | ⋮ |
| V1[0][15] | V1[1][15] | ..... | V1[171][15] | X1[15][0] | X1[15][1] | ... | X1[15][9] | V2[0][15] | V2[1][15] | ..... | V2[171][15] | X2[15][0] | X2[15][1] | ... | X2[15][9] |

RECORDING (TRANSMITTING) SEQUENCE →

| D[0][0] | D[0][1] | ..... | D[0][171] | H1[0][0] | H1[0][1] | ... | H1[0][9] | D[0][172] | D[0][173] | ..... | D[0][343] | H2[0][0] | H2[0][1] | ... | H2[0][9] |
|---|---|---|---|---|---|---|---|---|---|---|---|---|---|---|---|
| D[0][344] | D[0][345] | ..... | D[0][515] | H1[1][0] | H1[1][1] | ... | H1[1][9] | D[0][516] | D[0][517] | ..... | D[0][687] | H2[1][0] | H2[1][1] | ... | H2[1][9] |
| ⋮ | ⋮ | | ⋮ | ⋮ | ⋮ | | ⋮ | ⋮ | ⋮ | | ⋮ | ⋮ | ⋮ | | ⋮ |
| D[0][1720] | D[0][1721] | ..... | D[0][1891] | H1[5][0] | H1[5][1] | ... | H1[5][9] | D[0][1892] | D[0][1893] | ..... | D[0][2063] | H2[5][0] | H2[5][1] | ... | H2[5][9] |
| D[1][0] | D[1][1] | ..... | D[1][171] | H1[6][0] | H1[6][1] | ... | H1[6][9] | D[1][172] | D[1][173] | ..... | D[1][343] | H2[6][0] | H2[6][1] | ... | H2[6][9] |
| D[1][344] | D[1][345] | ..... | D[1][515] | H1[7][0] | H1[7][1] | ... | H1[7][9] | D[1][516] | D[1][517] | ..... | D[1][687] | H2[7][0] | H2[7][1] | ... | H2[7][9] |
| ⋮ | ⋮ | | ⋮ | ⋮ | ⋮ | | ⋮ | ⋮ | ⋮ | | ⋮ | ⋮ | ⋮ | | ⋮ |
| D[1][1720] | D[1][1721] | ..... | D[1][1891] | H1[11][0] | H1[11][1] | ... | H1[11][9] | D[1][1892] | D[1][1893] | ..... | D[1][2063] | H2[11][0] | H2[11][1] | ... | H2[11][9] |
| ⋮ | | | | ⋮ | | | | ⋮ | | | | ⋮ | | | |
| D[31][0] | D[31][1] | ..... | D[31][171] | H1[186][0] | H1[186][1] | ... | H1[186][9] | D[31][172] | D[31][173] | ..... | D[31][343] | H2[186][0] | H2[186][1] | ... | H2[186][9] |
| D[31][344] | D[31][345] | ..... | D[31][515] | H1[187][0] | H1[187][1] | ... | H1[187][9] | D[31][516] | D[31][517] | ..... | D[31][687] | H2[187][0] | H2[187][1] | ... | H2[187][9] |
| ⋮ | ⋮ | | ⋮ | ⋮ | ⋮ | | ⋮ | ⋮ | ⋮ | | ⋮ | ⋮ | ⋮ | | ⋮ |
| D[31][1720] | D[31][1721] | ..... | D[31][1891] | H1[191][0] | H1[191][1] | ... | H1[191][9] | D[31][1892] | D[31][1893] | ..... | D[31][2063] | H2[191][0] | H2[191][1] | ... | H2[191][9] |
| V1[0][0] | V1[1][0] | ..... | V1[171][0] | X1[0][0] | X1[0][1] | ... | X1[0][9] | V2[0][0] | V2[1][0] | ..... | V2[171][0] | X2[0][0] | X2[0][1] | ... | X2[0][9] |
| V1[0][1] | V1[1][1] | ..... | V1[171][1] | X1[1][0] | X1[1][1] | ... | X1[1][9] | V2[0][1] | V2[1][1] | ..... | V2[171][1] | X2[1][0] | X2[1][1] | ... | X2[1][9] |
| ⋮ | ⋮ | | ⋮ | ⋮ | ⋮ | | ⋮ | ⋮ | ⋮ | | ⋮ | ⋮ | ⋮ | | ⋮ |
| V1[0][15] | V1[1][15] | ..... | V1[171][15] | X1[15][0] | X1[15][1] | ... | X1[15][9] | V2[0][15] | V2[1][15] | ..... | V2[171][15] | X2[15][0] | X2[15][1] | ... | X2[15][9] |

RECORDING (TRANSMITTING) SEQUENCE →

| D[0][0] | D[0][1] | ..... | D[0][171] | H1[0][0] | H1[0][1] | ... | H1[0][9] | D[1][0] | D[1][1] | ..... | D[1][171] | H2[0][0] | H2[0][1] | ... | H2[0][9] |
|---|---|---|---|---|---|---|---|---|---|---|---|---|---|---|---|
| ⋮ | ⋮ | | ⋮ | ⋮ | ⋮ | | ⋮ | ⋮ | ⋮ | | ⋮ | ⋮ | ⋮ | | ⋮ |
| D[0][860] | D[0][861] | ..... | D[0][1031] | H1[5][0] | H1[5][1] | ... | H1[5][9] | D[1][860] | D[1][861] | ..... | D[1][1031] | H2[5][0] | H2[5][1] | ... | H2[5][9] |
| V1[0][0] | V1[1][0] | ..... | V1[171][0] | X1[0][0] | X1[0][1] | ... | X1[0][9] | D[1][1032] | D[1][1033] | ..... | D[1][1203] | H2[6][0] | H2[6][1] | ... | H2[6][9] |
| D[0][1032] | D[0][1033] | ..... | D[0][1203] | H1[6][0] | H1[6][1] | ... | H1[6][9] | ⋮ | ⋮ | | ⋮ | ⋮ | ⋮ | | ⋮ |
| ⋮ | ⋮ | | ⋮ | ⋮ | ⋮ | | ⋮ | D[1][1892] | D[1][1893] | ..... | D[1][2063] | H2[11][0] | H2[11][1] | ... | H2[11][9] |
| D[0][1892] | D[0][1893] | ..... | D[0][2063] | H1[11][0] | H1[11][1] | ... | H1[11][9] | V2[0][0] | V2[1][0] | ..... | V2[171][0] | X2[0][0] | X2[0][1] | ... | X2[0][9] |
| D[2][0] | D[2][1] | ..... | D[2][171] | H1[12][0] | H1[12][1] | ... | H1[12][9] | D[3][0] | D[3][1] | ..... | D[3][171] | H2[12][0] | H2[12][1] | ... | H2[12][9] |
| ⋮ | ⋮ | | ⋮ | ⋮ | ⋮ | | ⋮ | ⋮ | ⋮ | | ⋮ | ⋮ | ⋮ | | ⋮ |
| D[2][860] | D[2][861] | ..... | D[2][1031] | H1[17][0] | H1[17][1] | ... | H1[17][9] | D[3][860] | D[3][861] | ..... | D[3][1031] | H2[17][0] | H2[17][1] | ... | H2[17][9] |
| V1[0][1] | V1[1][1] | ..... | V1[171][1] | X1[1][0] | X1[1][1] | ... | X1[1][9] | D[3][1032] | D[3][1033] | ..... | D[3][1203] | H2[18][0] | H2[18][1] | ... | H2[18][9] |
| D[2][1032] | D[2][1033] | ..... | D[2][1203] | H1[18][0] | H1[18][1] | ... | H1[18][9] | ⋮ | ⋮ | | ⋮ | ⋮ | ⋮ | | ⋮ |
| ⋮ | ⋮ | | ⋮ | ⋮ | ⋮ | | ⋮ | D[3][1892] | D[3][1893] | ..... | D[3][2063] | H2[23][0] | H2[23][1] | ... | H2[23][9] |
| D[2][1892] | D[2][1893] | ..... | D[2][2063] | H1[23][0] | H1[23][1] | ... | H1[23][9] | V2[0][1] | V2[1][1] | ..... | V2[171][1] | X2[1][0] | X2[1][1] | ... | X2[1][9] |
| ⋮ | | | | ⋮ | | | | ⋮ | | | | ⋮ | | | |
| D[30][0] | D[30][1] | ..... | D[30][171] | H1[180][0] | H1[180][1] | ... | H1[180][9] | D[31][0] | D[31][1] | ..... | D[31][171] | H2[180][0] | H2[180][1] | ... | H2[180][9] |
| ⋮ | ⋮ | | ⋮ | ⋮ | ⋮ | | ⋮ | ⋮ | ⋮ | | ⋮ | ⋮ | ⋮ | | ⋮ |
| D[30][860] | D[30][861] | ..... | D[30][1031] | H1[185][0] | H1[185][1] | ... | H1[185][9] | D[31][860] | D[31][861] | ..... | D[31][1031] | H2[185][0] | H2[185][1] | ... | H2[185][9] |
| V1[0][15] | V1[1][15] | ..... | V1[171][15] | X1[15][0] | X1[15][1] | ... | X1[15][9] | D[31][1032] | D[31][1033] | ..... | D[31][1203] | H2[186][0] | H2[186][1] | ... | H2[186][9] |
| D[30][1032] | D[30][1033] | ..... | D[30][1203] | H1[186][0] | H1[186][1] | ... | H1[186][9] | ⋮ | ⋮ | | ⋮ | ⋮ | ⋮ | | ⋮ |
| ⋮ | ⋮ | | ⋮ | ⋮ | ⋮ | | ⋮ | D[31][1892] | D[31][1893] | ..... | D[31][2063] | H2[191][0] | H2[191][1] | ... | H2[191][9] |
| D[30][1892] | D[30][1893] | ..... | D[30][2063] | H1[191][0] | H1[191][1] | ... | H1[191][9] | V2[0][15] | V2[1][15] | ..... | V2[171][15] | X2[15][0] | X2[15][1] | ... | X2[15][9] |

RECORDING (TRANSMITTING) SEQUENCE →

ERROR CORRECTION CODING AND DECODING APPARATUSES

BACKGROUND OF THE INVENTION

The present invention relates to an error correction coding and decoding method, an error correction coding and decoding apparatus, and a storage and communication apparatus in which a plurality of product codes are used for error correction.

W. W. Peterson et al., ERROR-CORRECTING CODES, THE MIT PRESS, 1996, pp. 131–136 teaches the product codes for error correction. FIG. 22 of JP-A-8-125548 teaches coding of the product codes for error correction.

In storages to store data on a recording medium such as a magnetic tape device, a magnetic disk device, and an optical disk device and communication apparatuses to communicate data via a communication line or using radio signals, error correction codes have been employed as a technique to guarantee reliability of the data. For example, in a storage, source data is transformed using error correction codes into record data having redundancy. Therefore, even when the record data includes some errors, it is possible to conduct an error correcting (decoding) operation for reproduced data to thereby obtain the source data.

In this specification, a predetermined size of a data group which is processed according to an error correction code of one bit, two bits, or more is referred to as "byte".

In the error correction code system, "(n, k) code" indicates a fixed-length k-byte source data coded into a fixed-length n-byte codeword. Additionally, "linear code" indicates a linear summation of arbitrary two codewords is a codeword. Furthermore, "systematic code" indicates redundant data generated using source data in a predetermined method to be added to the source data such that the source data is included at particular positions of a codeword.

The errors occurring on recording media can conceptually be devided into two types of errors, namely, a random error and a burst error. The random error is an error taking place independently of a byte position of data. On the other hand, the burst error is an error which takes place in continuous bytes in data. The random error occurs, for example, at a relatively small local defect existing on the recording medium. The burst error occurs, for example, at a relatively large flaw or dirt existing on the recording medium.

A product code is known as an error correcting code to remarkably correct the random errors and the burst errors. FIG. 17 shows a data layout and a data recording sequence of a codeword of the product code or simply product code codeword obtained as below. Source (kV×kH)-byte data is encoded into a product code (nV bytes×nH bytes), where a code V is an (nV, kV) linear systematic code and a code H is an (nH, kH) linear systematic code. In the example, one codeword of the code H includes redundant data rH (=nH−kH bytes), and the code H can correct up to rH/2 bytes of errors in an ordinary correction. One codeword of the code V includes redundant data rV (=nV−kV bytes). When error positions are unknown, the code V can correct up to rV/2 bytes of errors in an ordinary correction. When the error positions are known, up to rV bytes of errors can be corrected in an erasure correction.

Description will now be given of data encoding and decoding and data recording and reproduction using the codeword of the product code or the product-code codeword.

In a data recording operation, (kV×kH)-byte source data is arranged in a two-dimensional array Ds (kV bytes×kH bytes). Next, each kV-byte column is coded by the code V and then rV-byte redundant data generated by the coding is added to the original column. As a result, a two-dimensional array Vs (rV bytes×kH bytes) is added to the array Ds to form a two-dimensional array (nV bytes×kH bytes). Next, each kH-byte row in a horizontal direction of the arrays including Ds and Vs is coded using the code H such that rH-byte redundant data generated as a result of the coding is added to the original row. As a result, two-dimensional arrays Hs and Xs (nV bytes×rH bytes in total) are respectively added to the arrays Ds and Vs to finally generate a product-code codeword including a two-dimensional array (nV bytes×nH bytes). Each column is a code-V codeword and each row is a code-H codeword. (Alternatively, the product-code codeword can be obtained as follows. First, Ds is coded using the code H to add Hs to Ds, and then Ds and Hs are coded using the code V to add Vs and Xs respectively to Ds and Hs.)

In this specification, a unit of a predetermined size of data used by a storage to access, a recording medium to record or to reproduce data is referred to as an error correction code (ECC) block hereinafter.

In a storage, the product-code codeword obtained as above is recorded as an ECC block on a recording medium, specifically, nV rows are sequentially recorded beginning at an upper-most row or predetermined order. Also, in the recording of each row, nH bytes are sequentially recorded in a direction indicated by an arrow mark in FIG. 17.

In a storage, logically sector data 1801 includes, for example, user data 1811, identifier data (ID; address) 1812, control information 1813, and error-detection-code (EDC) 1814 (redundant data of error detection code for user data and so on) as shown in FIG. 18. The storage apparatus codes the sector data 1801 and then records the coded sector data on a recording medium.

In a storage, the identifier data is present for some rows of Ds. In the data recording, a predetermined number of KV rows through Ds and Hs are sequentially recorded beginning at an associated upper-most row. Thereafter, a predetermined number of rV rows through Vs and Xs are sequentially recorded beginning at an associated upper-most row. That is, the rows of Ds and Hs and those of Vs and Xs are alternately recorded on a recording medium.

In when data is recorded in the storage just above, the identifiers in the ECC block are stored on the recording medium with a predetermined interval therebetween. Therefore, when it is desired to refer to an identifier during a data seek operation, the maximum latency which lapses before an identifier is referred to can be advantageously minimized.

On the other hand, in a data reproducing operation, reproduction data inputted to the storage apparatus is arranged in the form of a product-code codeword shown in FIG. 17 to decode the data. One of the decoding methods of a product code, firstly an ordinary correction is conducted for each codeword of the code H. For each codeword which cannot be corrected in the ordinary correction, an erasure flag is set to each bytes of the codeword. Next, using the erasure flags, an erasure correction is performed for each codeword of the code V. For each codeword of the code V, up to rV bytes of errors can be corrected by the erasure correction. Therefore, for the ECC block, a burst error having a maximum length of about rV×nH bytes can be corrected by the decoding. For the product code, there exist various decoding methods, in addition to the above, for example, an iterative decoding to increase reliability of the data.

W. W. Peterson et al. Error Correcting codes; second Edition, The MIT Press, 1972 teaches error correction codes.

By using the coding and decoding method above, even when a flaw or dirt exists on the recording medium and hence a burst error occurs in the reproduced data as a result, the storage apparatus can obtain the associated source data without difficulty only if the length of the burst error is equal to or less than the maximum length of the burst error which can be corrected using the ECC block.

However, for example, when a linear density of the recording medium is 100 bytes per millimeter (mm) and the maximum length of burst errors correctable by ECC block is 500 bytes, if a flaw or dirt having a length exceeding 5 mm exists on the recording medium and a burst error exceeding 500 bytes occurs in the reproduced data as a result, the burst error cannot be corrected using the ECC block. That is, the storage apparatus cannot obtain the correct source data.

In such a case, the product code of FIG. 17 can correct a bust error having a length of about rV×nH bytes. Therefore, to increase the maximum length of the correctable burst error using the product code as the ECC block, it is only necessary to increase the redundant data of the code V. For example, when the data amount of rV is doubled, the maximum length of the ECC block correctable burst error can also be doubled.

However, when the maximum length of the correctable burst error is increased by increasing rV, the code rate of the ECC block is disadvantageously reduced. That is, for example, in the storage system, there appears a problem that the formatting efficiency of the recording medium is deteriorated.

SUMMARY OF THE INVENTION

It is therefore an object of the present invention to provide an error correction coding and decoding method to code (generate) and to decode an ECC block in which the code ratio is similar to that of the product code of the prior art and in which the maximum length of the correctable burst error is more than that of the product code.

Another object of the present invention is to provide an error correction coding and decoding method to code (generate) and to decode an ECC block in which data of a plurality of sectors is treated as source data using one ECC block, and even when there occurs an error not correctable by the ECC block, data of several sectors included in the ECC block can be correctly obtained without an difficulty.

Another object of the present invention is to provide an error correction coding and decoding method to code (generate) and to decode an ECC block in which there are a plurality of identifiers (IDs) with a certain interval in output sequence of an ECC block in order to decrease the maximum latency until referring to an ID.

To achieve the problems, according to the present invention, there is provided an error correction coding method which generates a plurality of product-code codewords and which alternately outputs each row of the product-code codewords.

In addition, data of a plurality of sectors is collected and is coded into one ECC block. When it is assumed that random errors occur, the data is arranged such that data of the same sector is contained in one product-code codeword. When it is assumed that burst errors dominantly occur, the data is arranged such that a plurality of data of a sector are not intervened by a data of other sector.

When source data includes a plurality of identifies, each row of each product-code codeword is re-arranged and is then outputted such that the identifiers exist at a predetermined interval in the ECC block.

BRIEF DESCRIPTION OF THE DRAWINGS

The objects and features of the present invention will become more apparent from the consideration of the following detailed description taken in conjunction with the accompanying drawings in which:

FIG. 8 is a schematic diagram showing an example of a sector data layout of an ECC block and an ECC block data recording (transmitting) sequence in an embodiment according to the present invention;

FIG. 9 is a schematic diagram showing another example of a sector data layout of an ECC block and an ECC block data recording (transmitting) sequence in an embodiment according to the present invention;

FIG. 10 is a schematic diagram showing another example of a sector data layout of an ECC block and an ECC block data recording (transmitting) sequence in an embodiment according to the present invention;

FIG. 11 is a schematic diagram showing another example of a sector data layout of an ECC block and an ECC block data recording (transmitting) sequence in an embodiment according to the present invention;

DESCRIPTION OF THE EMBODIMENTS

Figure 1:
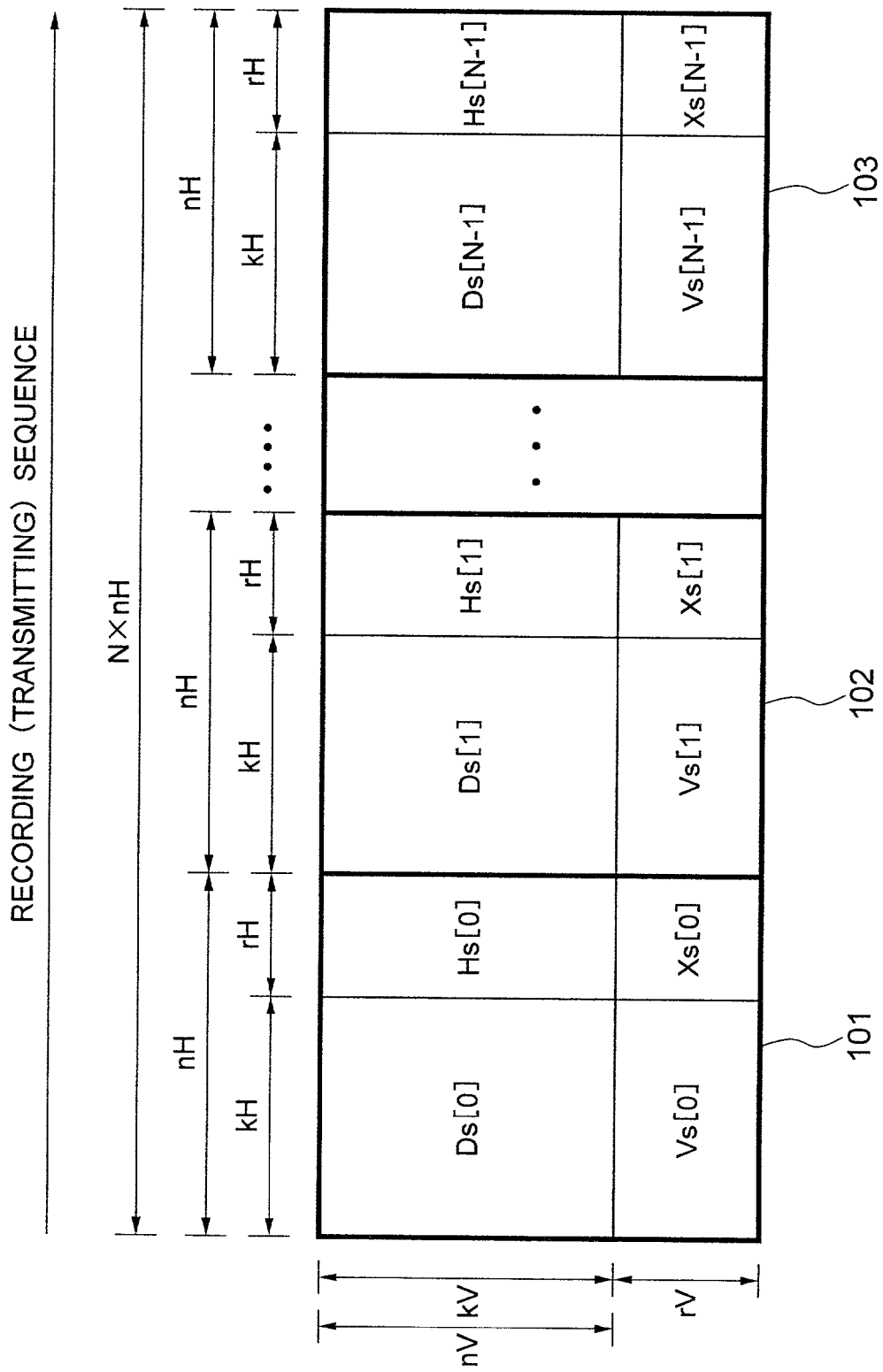
FIG. 1 is a schematic diagram showing a data layout of an ECC block and an ECC block data recording (transmitting) sequence according to the present invention.

Description will now be given of an embodiment of the present invention. In this connection, although the present invention can be commonly applied to a storage and a communication device which use an error correcting technique to guarantee reliability of data, description will be given of a case in which the present invention is applied to a storage using an optical disk. In the drawings showing an ECC block recording (transmitting) sequence associated with the specification, the rows are outputted beginning at the upper-most row, and byte data is outputted in each row in the recording (transmitting) sequence indicated in the drawings.

First, description will be given of a first embodiment of the present invention.

Figure 2:
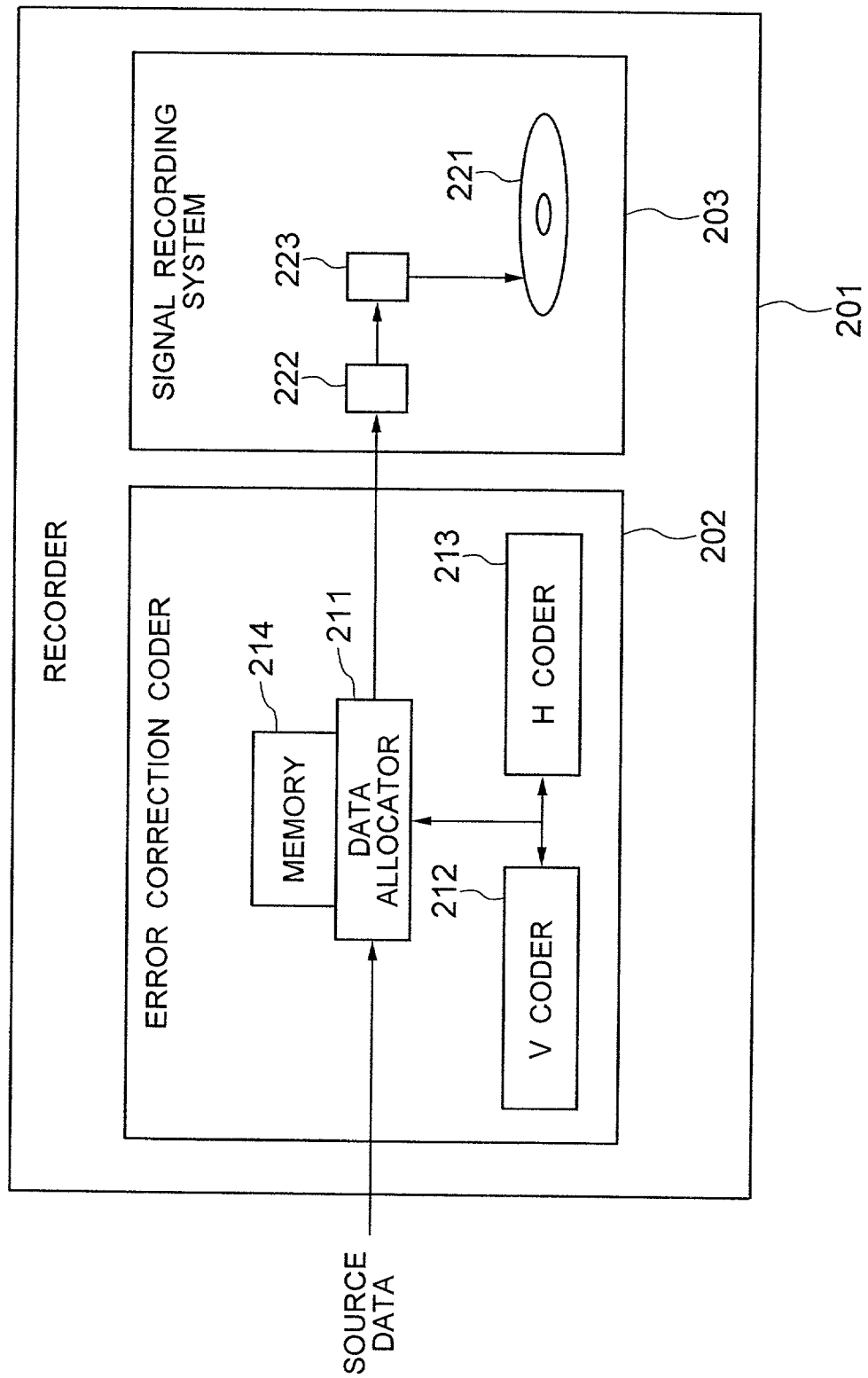
FIG. 2 is a block diagram showing an outline of constitution of an error correction coding device according to the present invention and a recording apparatus using the error correction coding device.

FIG. 2 shows in a block diagram a configuration of an error correction coding device according to the present invention and a recording apparatus 201 using the error correction coding device. The recording apparatus 201 includes an error correction coding device 202 and a signal recording system 203. The error correction coding device 202 includes a data allocating unit 211, a V coding unit 212, and an H coding unit 213. The data allocating unit 211 includes a memory 214. The signal recording system includes an optical disk 221, a signal modulating unit 222, an optical head 223, and a motor, not shown.

FIG. 1 shows a data layout and a recording sequence of ECC block data generated by the error correction coding device 202 in the configuration of the embodiment.

The data allocator 211 subdivides (N×kV×kH)-byte source data into N two-dimensional arrays Ds[0], Ds[1], . . . , Ds[N−1] each of which is in the form of kV bytes×kH bytes, and allocates the arrays in a memory 214. The allocator 211 then sends the arrays Ds[0], Ds[1], . . . , Ds[N−1] to the V coder 212 and the H coder 213.

For Ds[0], Ds[1], . . . , Ds[N−1], the V coder 212 conducts a code-V coding (nV, kV) for each column and the H coder 213 conducts a code-H coding (nH, kH) for each row. Redundant data resultant from the coding operations is sent to the data allocator 211. Specifically, for Ds[i] (kV bytes× kH bytes) and for all i of 0≦i≦N−1, the V-coder 212 conducts coding in a column direction to generate redundant data Vs[i] (rV bytes×kH bytes) the H-coder 213 conducts coding in a row direction to generate redundant data Hs[i] (kV bytes×rH bytes). The H-coder 213 conducts coding in a row direction for Vs[i] (rV bytes×kH bytes) or the V-coder 212 conducts coding in a column direction for Hs[i] (kV bytes×rH bytes) to generate redundant data Xs[i] (rV bytes× rH bytes). Having received the redundant data, the data allocator 211 allocates the redundant data in the memory 214 to resultantly obtain N product-code codewords 101, 102, . . . , 103, each codewords in the form of nV bytes×nH bytes. Thereafter, from the N product-code codewords in the memory 214, the data allocator 211 outputs, as an ECC block, each row of each product-code codeword for each of the N product-code codewords to the signal modulator 222.

When comparing with a case in which an (nV×nH) product code is used as an ECC block according to the (nV, kV) code V and the (nH, kH) code H, the error correction coding device 202 can produce as above an ECC block in which the code rate is similar to the above case and the maximum correctable burst error length is about N times that of the above case.

Next, description will be given of a second embodiment of the present invention.

Figure 4:
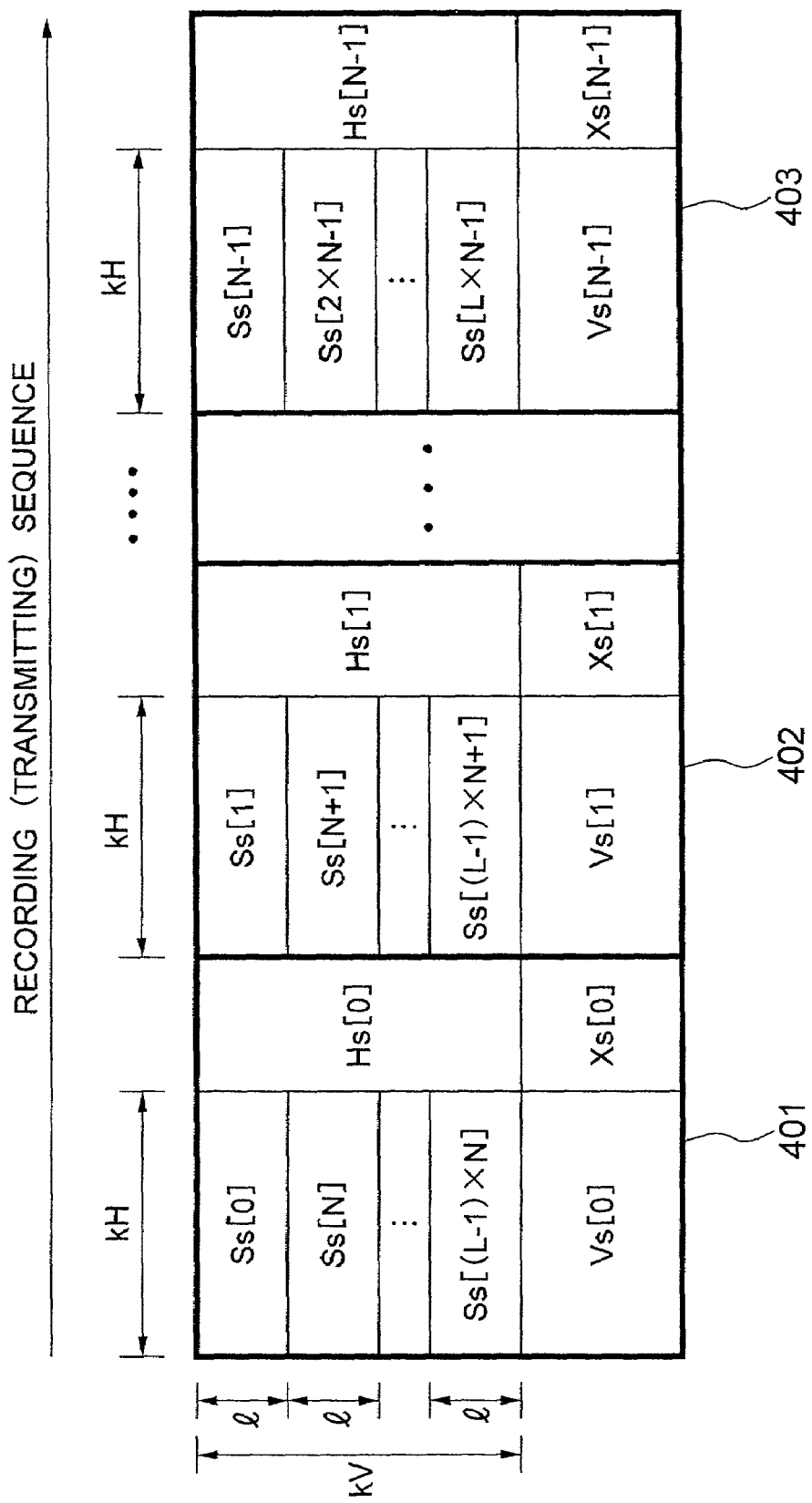
FIG. 4 is a schematic diagram showing a sector data layout of an ECC block and an ECC block data recording (transmitting) sequence in an embodiment according to the present invention.

FIG. 4 shows a sector data layout in an ECC block and a recording sequence of ECC blocks generated by an error correction coding device in an embodiment of the present invention, where L×l=kV.

The data allocator 211 first subdivides (N×kV×kH)-byte source data including (L×N) sectors Ss[0], Ss[1], . . . , Ss[L×N−1] of which each includes l×kH bytes into N two-dimensional arrays of which each is in the form of kV bytes×kH bytes. The allocator 211 then allocates the arrays in the memory 214 such that each of the two-dimensional arrays includes a two-dimensional array of L sectors each of which is in the form of l bytes×kH bytes. The allocator 211 sends the N two-dimensional arrays to the V-coder 212 and the H-coder 213.

Subsequently, each column of the N (kV bytes×kH bytes) two-dimensional array, the V coder 212 conducts coding according to (nV, kV) code V and the H coder 213 conducts coding according to the (nH, kH) code H. Redundant data obtained as a result of the coding operations above is sent to the data allocator 211. Having received the redundant data, the data allocator 211 allocates the redundant data in the memory 214 to resultantly obtain N product-code codewords 401, 402, . . . , 403 each of which is in the form of nV bytes×nH bytes. Thereafter, from the N product-code codewords in the memory 214, the data allocator 211 outputs, as an ECC block, each row of each product-code codeword for each of the N product-code codewords to the signal modulator 222.

FIG. 8 shows an example of the embodiment, specifically, a data layout of sector data in the ECC block and an ECC block recording sequence under a condition of N=2, kV=192, nV=208, kH=172, nH=182, L=16, and l=12. In this case, the ECC block includes two product-code codewords 801 and 802, each sector includes 2064 bytes, and the ECC block includes 32 sectors. The 2064-byte sector includes, for example, 2048-byte user data, 6-byte identifier (or a code obtained by coding the identifier using an error correction code), 6-byte control information, and 4-byte EDC. The 2064-byte data of sector Ss[i] (0≦i≦31) includes D[i][0], D[i][1], . . . , D[i][2063] in FIG. 8. V1[i][j] (0≦i≦171, 0≦j≦15) is the (j+1)-th byte of the redundant data obtained for the (i+1)-th column of the product-code codeword 801 according to code V. Additionally, H1[i][j] (0≦i≦191, 0≦j≦9) is the (j+1)-th byte of the redundant data obtained for the (i+1)-th row of the product-code codeword 801 according to code H. X1[i][j] (0≦i≦15, 0≦j≦9) is the (j+1)-th byte of the redundant data obtained for the (193+ i)-th row of the product-code codeword 801 according to code H (or the (i+1)-th byte of the redundant data obtained for the (173+j)-th column thereof according to code V). Similarly, V2[i][j], H2[i][j], and X2[i][j] are also items corresponding to the product-code codeword 802.

The error correction coding device 202 can generate an ECC block as follows. In a case in which the random errors dominantly occur as compared with the burst error in the data associated with the storing medium, even when several product-codes cannot be corrected in the ECC block and hence the ECC block cannot be corrected in the reproducing operation, source data of the sectors contained in the product codes other than the non-correctable product codes can be correctly obtained.

Description will be given of a third embodiment according to the present invention.

Figure 5:
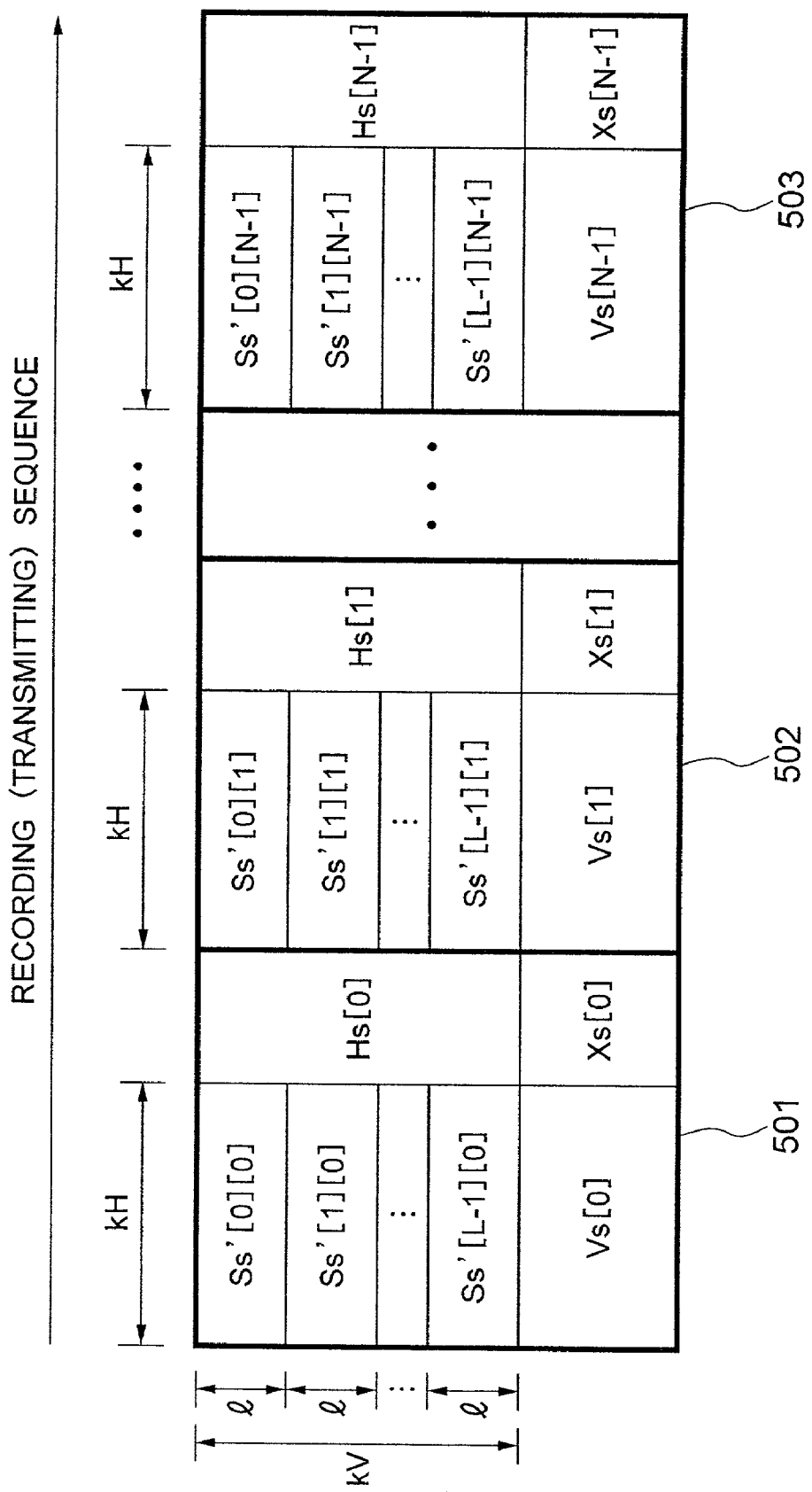
FIG. 5 is a schematic diagram showing a sector data layout of an ECC block and an ECC block data recording (transmitting) sequence in another embodiment according to the present invention.

FIG. 5 shows a sector data layout of an ECC block generated by an error correction coding device of the embodiment and a recording sequence of the ECC block, where L×l=kV.

First, the data allocator 211 subdivides each of the L (N×l×kH)-byte sectors Ss[0], Ss[1], ..., Ss[L−1] into N (l bytes×kH bytes) two-dimensional arrays For example, Ss[0] is divided into Ss'[0][0], Ss'[0][1], ..., Ss'[0][N−1]. The N items are then allocated respectively to N (kV bytes×kH bytes) two-dimensional arrays in the memory 214. In the arrangement of the items in the recording operation, a plurality of data of a sector are not intervened with a data of other sectors. The allocator 211 then sends the N (kV bytes×kH bytes) two dimensional arrays to the V coder 212 and the H coder 213. Thereafter, for N (kV bytes×kH bytes) two dimensional arrays, the V coder 212 conducts a code-V coding (nV, kV) for each column, and the H coder 213 conducts a code-H coding (nH, kH) for each row. Redundant data obtained from the coding operations is sent to the data allocator 211. Having received the redundant data, the data allocator 211 allocates the redundant data in the memory 214 to resultantly obtain N product-code codewords 501, 502, ..., 503 of which each is in the form of nV bytes×nH bytes. Thereafter, from the N product-code codewords in the memory 214, the data allocator 211 outputs, as an ECC block, each row of each product-code codeword in an alternating manner for each of the N product-code codewords to the signal modulator 222.

FIG. 9 shows an example of the embodiment, specifically, a data layout of sector data in the ECC block and an ECC block recording sequence under a condition of N=2, kV=192, nV=208, kH=172, nH=182, L=32, and l=6. In this case, the ECC block includes two product-code codewords 901 and 902, each sector includes 2064 bytes, and the ECC block includes 32 sectors. The 2064-byte sector includes, for example, 2048-byte user data, 6-byte identifier (or a code obtained by coding the identifier using an error correction code), 6-byte control information, and 4-byte EDC.

The 2064-byte data of sector Ss[i] (0≦i≦31) includes D[i][0], D[i][1], ..., D[i][2063] in FIG. 9. V1[i][j] (0≦i≦171, 0≦j≦15) is the (j+1)-th byte of the redundant data obtained for the (i+1)-th column of the product-code codeword 901 according to code V. Additionally, H1[i][j] (0≦i≦191, 0≦j≦9) is the (j+1)-th byte of the redundant data obtained for the (i+1)-th row of the product-code codeword 901 according to code H. X1[i][j] (0≦i≦15, 0≦j≦q) is the (j+1)-th byte of redundant data obtained for the (193+i)-th of the product-code codeword 901 according to code H (or the (i+1)-th byte of the redundant data obtained for the (173+j)-th column thereof according to code V). Similarly, V2[i][j], H2[i][j], and X2[i][j] are also items corresponding to the product-code codeword 902.

The error correction coding device 202 can generate an ECC block as follows. In a case in which the burst errors dominantly occurs as compared with the random errors in the data associated with the storing medium, even when the ECC block cannot be corrected in the reproducing operation, source data of sectors free of the burst errors can be correctly obtained.

Description will be given of a fourth embodiment according to the present invention.

Figure 6:
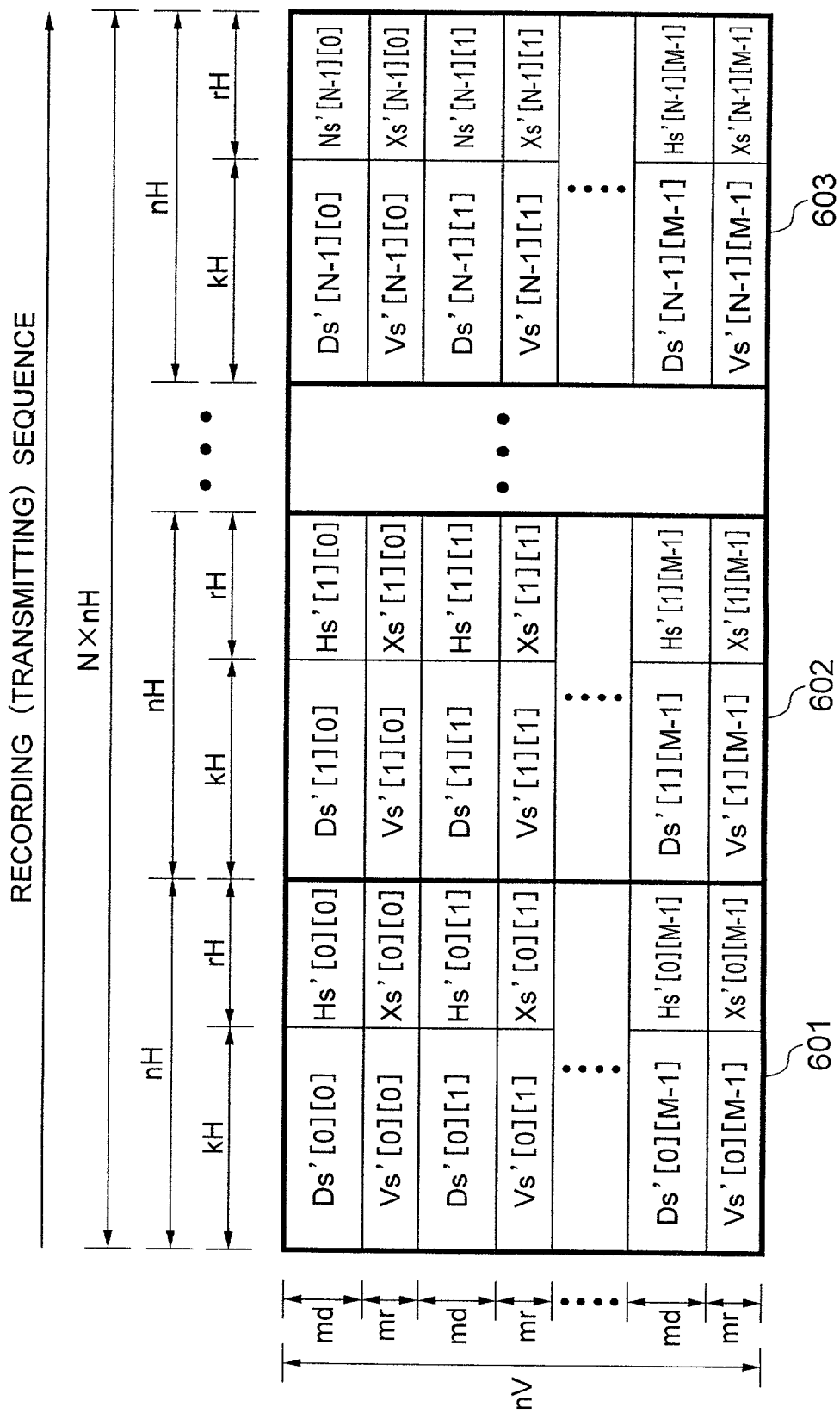
FIG. 6 is a schematic diagram an ECC block data recording (transmitting) sequence in an embodiment according to the present invention.

FIG. 6 shows a sector data layout of an ECC block generated by an error correction coding device of the embodiment and a recording sequence of the ECC block, where M×md=kV and M×mr=rV. Assume that for any i (0≦i≦N−1), an identifier (ID) exists in Ds[i] of FIG. 1 in every md-th row.

Operation of this embodiment is substantially the same as that of the first embodiment up to the point at which the data allocator 211 obtains N product-code codewords 101, 102, ..., 103 of FIG. 1.

After having obtained N product-code codewords, the data allocator 211 rearranges, for each i of 0≦i≦N−1, the kV rows existing in Ds[i] and Hs[i] and the rV rows existing in Vs[i] and Xs[i] such that md rows and mr rows are alternately disposed in the memory 214. As a result, there are obtained rearranged arrays 601, 602, ..., 603 of the N product-code codewords of which each is in the form of nV bytes×nH bytes. That is, the data allocator 211 subdivides a (kV bytes×nH bytes) two-dimensional array including a two-dimensional array of Ds[i] and Hs[i] into M (md bytes×nH bytes) two-dimensional arrays; a two-dimensional array of Ds'[i][0] and Hs'[i][0], a two-dimensional array of Ds'[i][1] and Hs' [i][1], ..., and a two-dimensional array of Ds'[i][M−1] and Hs'[i][M−1]. Moreover, the data allocator 211 subdivides a (rV bytes×nH bytes) two-dimensional array including a two-dimensional array of Vs[i] and Xs[i] into M (mr bytes×nH bytes) two dimensional arrays; a two-dimensional array of Vs'[i][0] and Xs'[i][0], a two-dimensional array of Vs'[i][1] and Xs'[i][1], ..., and a two-dimensional array of Vs'[i][M−1] and Xs'[i][M−1]. The data allocator 211 then rearranges these arrays such that the (md bytes×nH bytes) two dimensional array and the (mr bytes×nH bytes) two dimensional array are alternately allocated in the memory 214. As a result, there are obtained the rearranged N (nV bytes×nH bytes) product-code codewords.

Thereafter, from the N product-code codewords thus rearranged in the memory 214, the data allocator 211 outputs, as an ECC block, each row of each product-code codeword in an alternating manner for each of the N product-code codewords to the signal modulator 222.

Therefore, the error correction coding device 202 can generate an ECC block in which when it is desired to refer to an identifier (ID) during a data seek operation, the maximum latency which lapses before an identifier is referred to can be relatively reduced.

Description will be given of a fifth embodiment according to the present invention.

Figure 7:
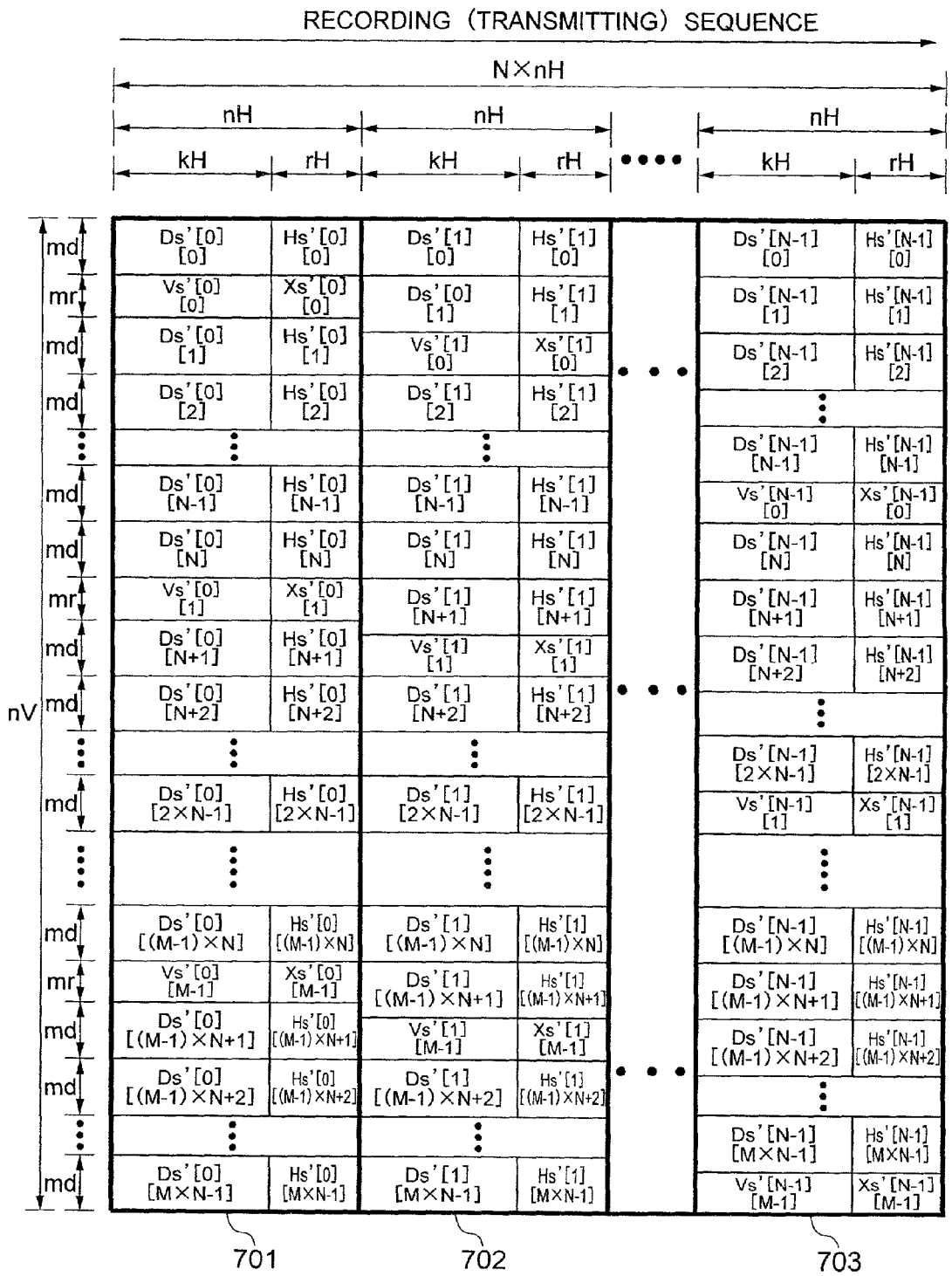
FIG. 7 is a diagram an ECC block data recording (transmitting) sequence in another embodiment according to the present invention.

FIG. 7 shows a sector data layout of an ECC block generated by an error correction coding device of the embodiment and a recording sequence of the ECC block, where N×M×md=kV, M×mr=rV, and mr≦md. Assume that for mi (mr≦mi≦md), an identifier (ID) exists in every (md×i+N×md×j+mi)-th row of Ds[i] of FIG. 1 for each i of (0≦i≦N−1) and each j of (0≦j≦M−1).

Operation of this embodiment is almost the same as that of the first embodiment up to the point at which the data allocator 211 obtains N product-code codewords 101, 102, ..., 103 of FIG. 1. After having obtained N product-code codewords, the data allocator 211 subdivides, for each i of 0≦i≦N−1, the kV rows existing in Ds[i] and Hs[i] and the rV rows existing in Vs[i] and Xs[i] respectively into md and mr items and then rearranges these items in the memory 214 such that the identifiers exists at a predetermined interval of rows in the (nV bytes×nH bytes) two-dimensional array in the recording of the ECC block. As a result the rearrangement, there are obtained N (nV bytes×nH bytes) product-code codewords 701, 702, ..., 703.

That is, the data allocator 211 subdivides a (kV bytes×nH bytes) two-dimensional array including a two-dimensional array of Ds[i] and Hs[i] into N×M (md bytes×nH bytes) two dimensional arrays; a two-dimensional array of Ds'[i][0] and Hs'[i][0], a two-dimensional array of Ds'[i][1] and Hs'[i][1], . . . , and a two-dimensional array of Ds'[i][N× M−1] and Hs'[i][N×M−1]. Moreover, the data allocator 211 subdivides the (rV bytes×nH bytes) two-dimensional array including a two-dimensional array of Vs[i] and Xs[i] into M (mr bytes×nH bytes) two dimensional arrays; a two-dimensional array of Vs'[i][0] and Xs'[i][0], a two-dimensional array of Vs'[i][1] and Xs'[i][1], . . . , and a two-dimensional array of Vs'[i][M−1] and Xs'[i][M−1]. The data allocator 211 then rearranges these arrays in the memory 214 for each j of $0 \leq j \leq M-1$ such that the (mr bytes×nH bytes) two-dimensional array including a two-dimensional array of Vs'[i][j] and Xs'[i][j] is just inserted between two (md bytes×nH bytes) two-dimensional arrays; a two-dimensional array of Ds'[i][N×j+i] and Hs[i][N×j+i] and a two-dimensional array of Ds'[i][N×j+i+1] and Hs[i][N×j+i+1]. Resultantly, there are obtained the rearranged N (nV bytes×nH bytes) product-code codewords. Thereafter, from the N product-code codewords thus rearranged in the memory 214, the data allocator 211 outputs, as an ECC block, each row of each product-code codeword for each of the N product-code codewords to the signal modulator 222.

Description will be given of an example of the embodiment in combination with an example of the second embodiment.

FIG. 10 shows an example of the embodiment, specifically, a data layout of sector data in the ECC block and an ECC block recording sequence. That is, in the example of the second embodiment (N=2, kV=192, rV=16, nV=208, and nH=182) shown in FIG. 8, each row of each product-code codeword is rearranged under a condition of md=6 and mr=1. In this case, the ECC block includes two rearranged product-code codewords 1001 and 1002.

It is only necessary for the data allocator 211 to beforehand arrange source data as below. For each even i of $0 \leq i \leq 31$, a 6-byte identifier (or a code obtained by coding the identifier using a predetermined error correction code) exists as D[i][0], D[i][1], . . . , D[i][5] of 2064-byte data D[i][0], D[i][1], . . . , D[i][2063] of sector Ss[i]. For each odd i of $0 \leq i \leq 31$, a 6-byte identifier (or a code obtained by coding the identifier using a predetermined error correction code) exists as D[i][1032], D[i][1033], . . . , D[i][1037] of 2064-byte data D[i][0], D[i][1], . . . , D[i][2063] of sector Ss[i]. Resultantly, the identifier appears in the output sequence of the ECC block at an interval of 2360 bytes.

Description will be given of an example of the embodiment in combination with an example of the third embodiment.

Figure 11:
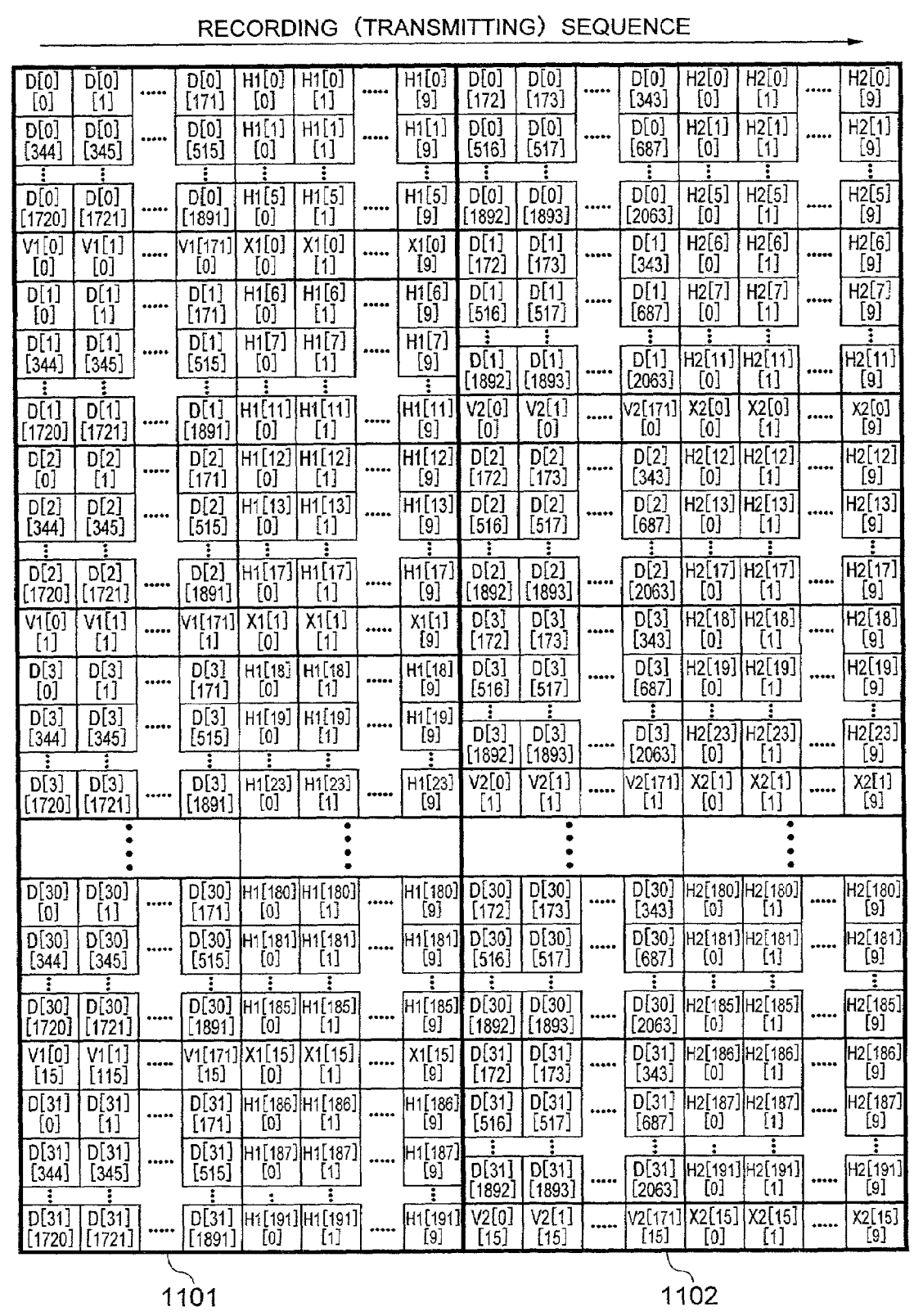

FIG. 11 shows an example of the embodiment, specifically, a data layout of sector data in the ECC block and an ECC block recording sequence. That is, in the example of the third embodiment (N=2, kV=192, rV=16, nV=208, and nH=182) shown in FIG. 9, each row of each product-code codeword is rearranged under a condition of md=6 and mr=1 according to the fifth embodiment. In this case, the ECC block includes two rearranged product-code codewords 1101 and 1102.

The data allocator 211 beforehand arranges the pertinent data as follows. For each even i of $0 \leq i \leq 31$, a 6-byte identifier (or a code obtained by coding the identifier using a predetermined error correction code) exists as D[i][0], D[i][1], . . . , D[i][5] of 2064-byte data D[i][0], D[i][1], . . . , D[i][2063] of sector Ss[i]. For each odd i of $0 \leq i \leq 31$, a 6-byte identifier (or a code obtained by coding the identifier using a predetermined error correction code) exists as D[i] [172], D[i][173], . . . , D[i][177] of 2064-byte data D[i][0], D[i][1], . . . , D[i][2063] of sector Ss[i]. The identifier appears in the ECC block at an interval of 2360 bytes.

Therefore, in the error correction coding device 202 can generate an ECC block in which when it is desired to refer to an identifier (ID) during a data seek operation, the maximum latency which lapses before an identifier is referred to can be relatively minimized.

In the description of the first to fifth embodiments, the data allocator 211 arranges the source data and product-code codewords in the form of a two-dimensional array in the memory 214. However, regardless of the dimension or form of such data in the memory 214, it is possible to arrange a data layout of the ECC block accessable by the data allocator.

In the description of the fourth and fifth embodiments, each row of the product-code codewords is rearranged in the memory 214. However, it is possible for the data allocator 211 to change the sequence of accessing the recorded rows of data instead of the rearrangement of the rows of the codewords.

In the description of the first to fifth embodiments, the data allocator 211 arranges data in a two-dimensional array and then the coding of the data is conducted by the V coder 212 and the H coder 213. However, it is also possible that when the data allocator 211 receives part of source data, the data allocator 211 sends the data to the V coder 212 and the H coder 213. The V coder 212 and the H coder 213 then start coding the data.

Moreover, the data allocator 211 receives N product-code codewords, and then sends them to the signal modulator 222. However, it is also possible that when the data allocator 211 receives part of the N product-code codewords, the data allocator 211 starts sending the received codewords to the signal modulator 222.

In the recording apparatus of FIG. 2 using an error correction coding device of either one of the first to fifth embodiments, having received the ECC block outputted from the error correction coding device 211, the signal modulator 222 modulates the ECC block into signals to be recorded on a recording media and then sends the signals to an optical write head 223. The optical head 223 writes the signals at a target position on an optical disk 221. When comparing with a case in which an (nV×nH) product code is used as an ECC block according to the (nV, kV) code V and the (nH, kH) code H, the recorder 201 can produce as above an ECC block in which the code rate is similar to the above case and the maximum correctable burst error length is about N times that of the above case.

Figure 3:
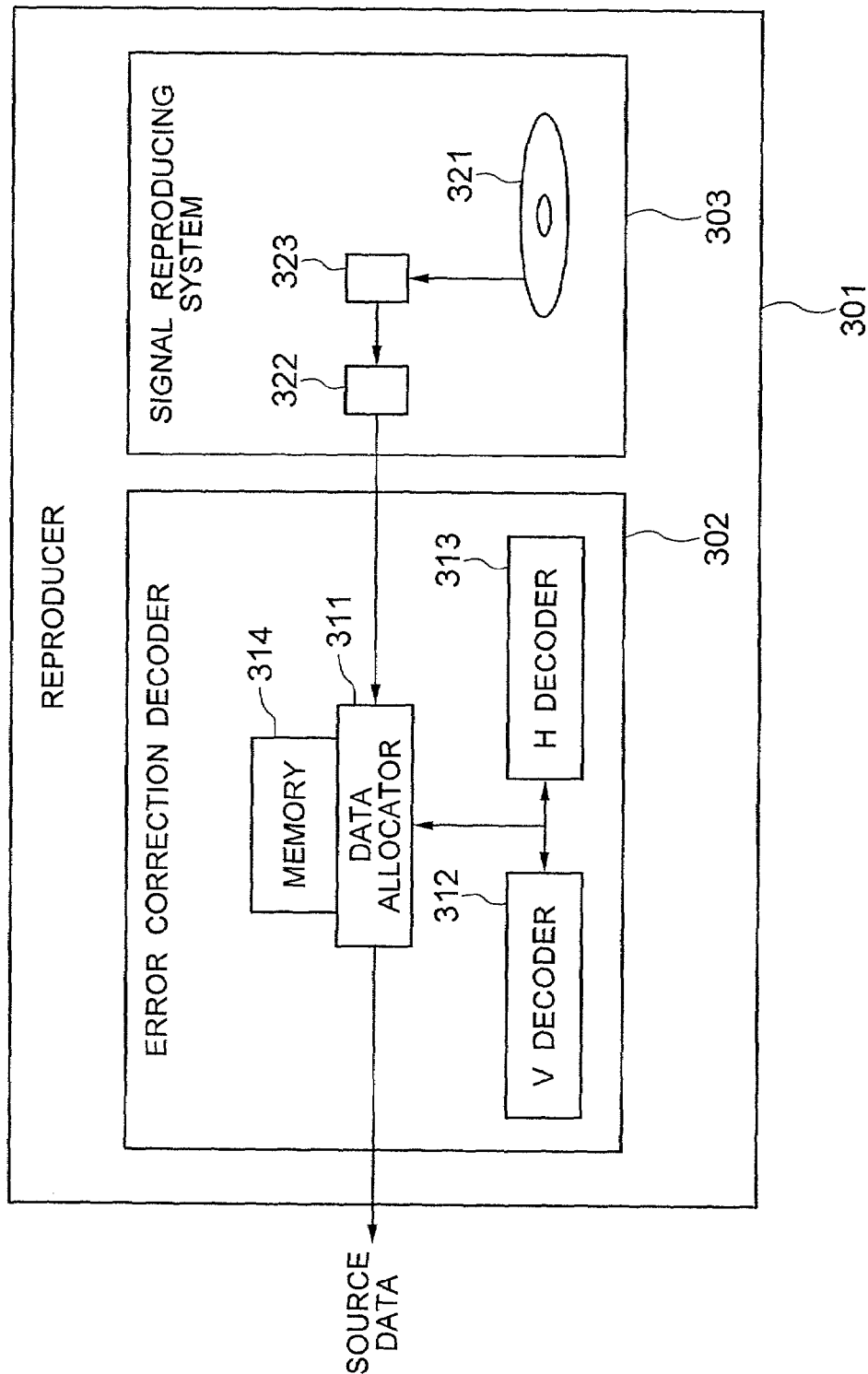
FIG. 3 is a block diagram showing an outline of constitution of an error correction decoding device according to the present invention and a reproducing apparatus using the error correction decoding device.

FIG. 3 is a schematic diagram showing an outline of constitution of an error correction decoding device according to the present invention and a reproducing apparatus using the error correction decoding device. The reproducing apparatus 301 includes an error correction decoding device 302 and a signal reproducing system 303. The error correction decoding device 302 includes a data allocator 311, a V decoder 312, and an H decoder 313. The data allocator 311 includes a memory 314. The signal reproducing system 303 includes an optical disk 321, a signal demodulator 322, an optical head 323, and a motor, not shown.

In the error correction decoding device corresponding to the error correcting coding device of either one of the first to fifth embodiments, the data allocator 311 receives, from a storing medium, reproduced data having a length N×nV× nH bytes as N product codes (which may be rearranged in some case) which may have some errors in some cases. The data allocator 311 arranges the data in the form of associated N (nv bytes×nH bytes) product-code codewords in the memory 314. The data allocator 311 then sends the product-code codewords to the V decoder 312 and H decoder 313. Subsequently, like in the ordinary product-code decoding, the H decoder 313 and the V decoder 312 cooperatively decodes each product-code codewords and then sends data resultant from the correction to the data allocator 311. Having received the correction result, the data allocator 311 corrects the data of the product-code codewords in the memory 314 according to the correction result to resultantly obtain source data.

Instead of arranging the reproduced data in the form of product-code codewords in the memory 314, it is possible for the data allocator 311 to previously memorize an item indicating a data layout of the ECC block to access data in the memory 314 according to the contents of the memorized item. Instead of arranging the data in the form of product-code codewords and then achieving the decoding operation, it is also possible that when part of the reproduced data is received, the data allocator 311 sends the received data to the V decoder 312 and the H decoder 313 such that the V decoder 312 and the H decoder 313 start decoding the data.

In the error correction decoding device 302 corresponding to the second embodiment, even in a case in which some product-codes of the ECC block cannot be corrected and hence the ECC block cannot be corrected, when the random errors dominantly occur as compared with the burst errors in the data associated with the storing medium, source data of sectors contained in the product codes other than the non-correctable product codes can be appropriately obtained.

In the error correction decoding device 302 corresponding to the third embodiment, even in a case in which some product-codes of the ECC block cannot be corrected and hence the ECC block cannot be corrected, when the burst errors dominantly occur as compared with the random errors in the data associated with the storing medium, presence or absence of data errors (burst errors) in each sector can be determined using the code H or the EDC. Resultantly, there are determined sectors free of the errors. That is, source data of such sectors can be correctly obtained.

In the reproducing apparatus 301 using the error correction decoding device 302 corresponding to the error correcting coding device of either one of the first to fifth embodiments, the optical head 323 reads signals from a target position on the optical disk and sends the signals to the signal modulator 322. The signal modulator 322 conducts operations such as equalization and demodulation for the signals and then outputs reproduced data as the ECC block to the error correction decoding device 302.

In the error correction decoding device 302 corresponding to the error correcting coding device of the fourth or fifth embodiment and the reproducing apparatus 301 using the error correction decoding device 302, when it is desired to refer to an identifier (ID) during a data seek operation to determine a target position on the optical disk, since the identifier exists in the ECC block at a predetermined interval, the maximum latency which lapses before the identifier is referred to takes a relatively small value.

Figure 12:
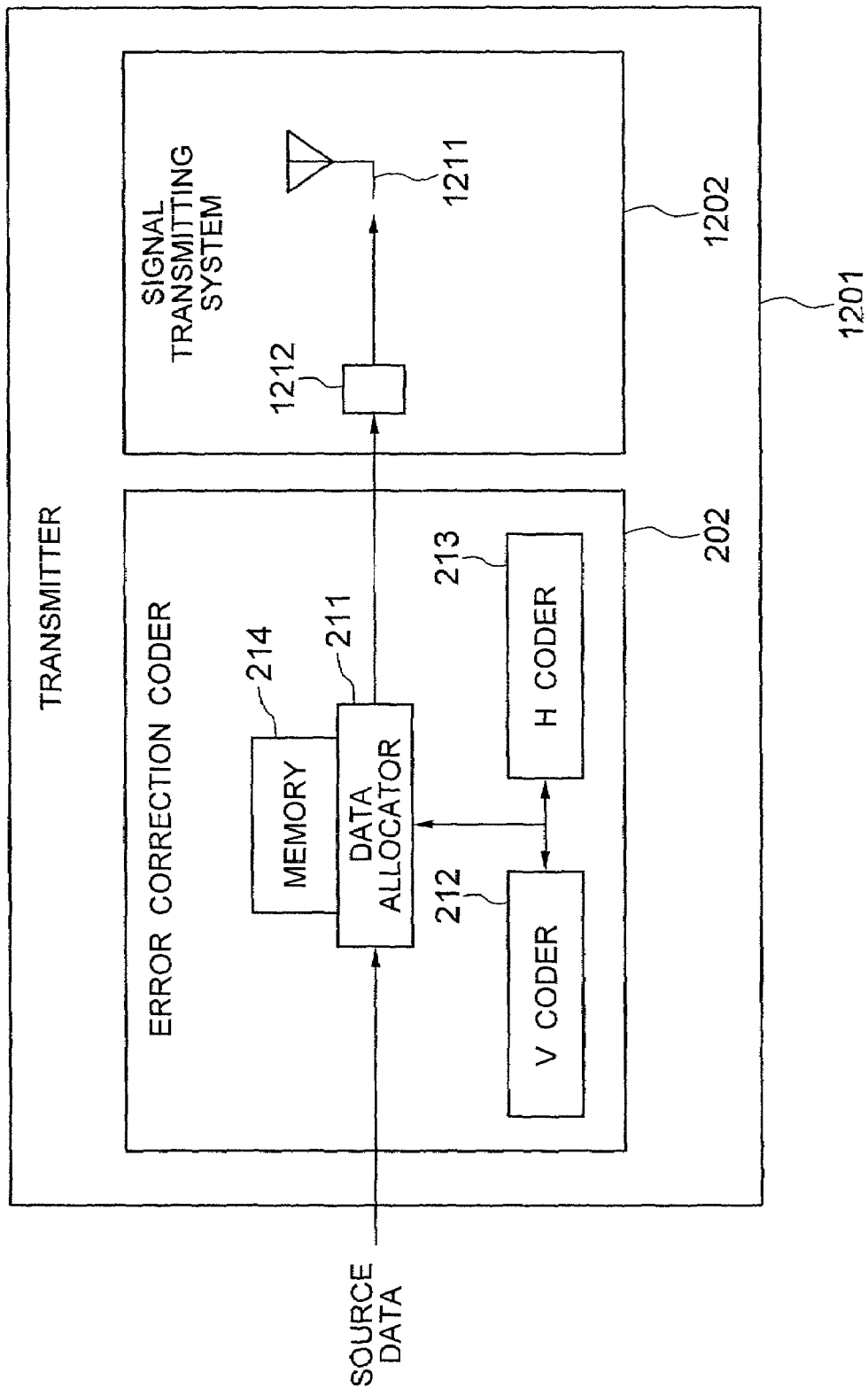
FIG. 12 is a block diagram showing an outline of constitution of a transmitting apparatus using an error correction coding device according to the present invention.
Figure 13:
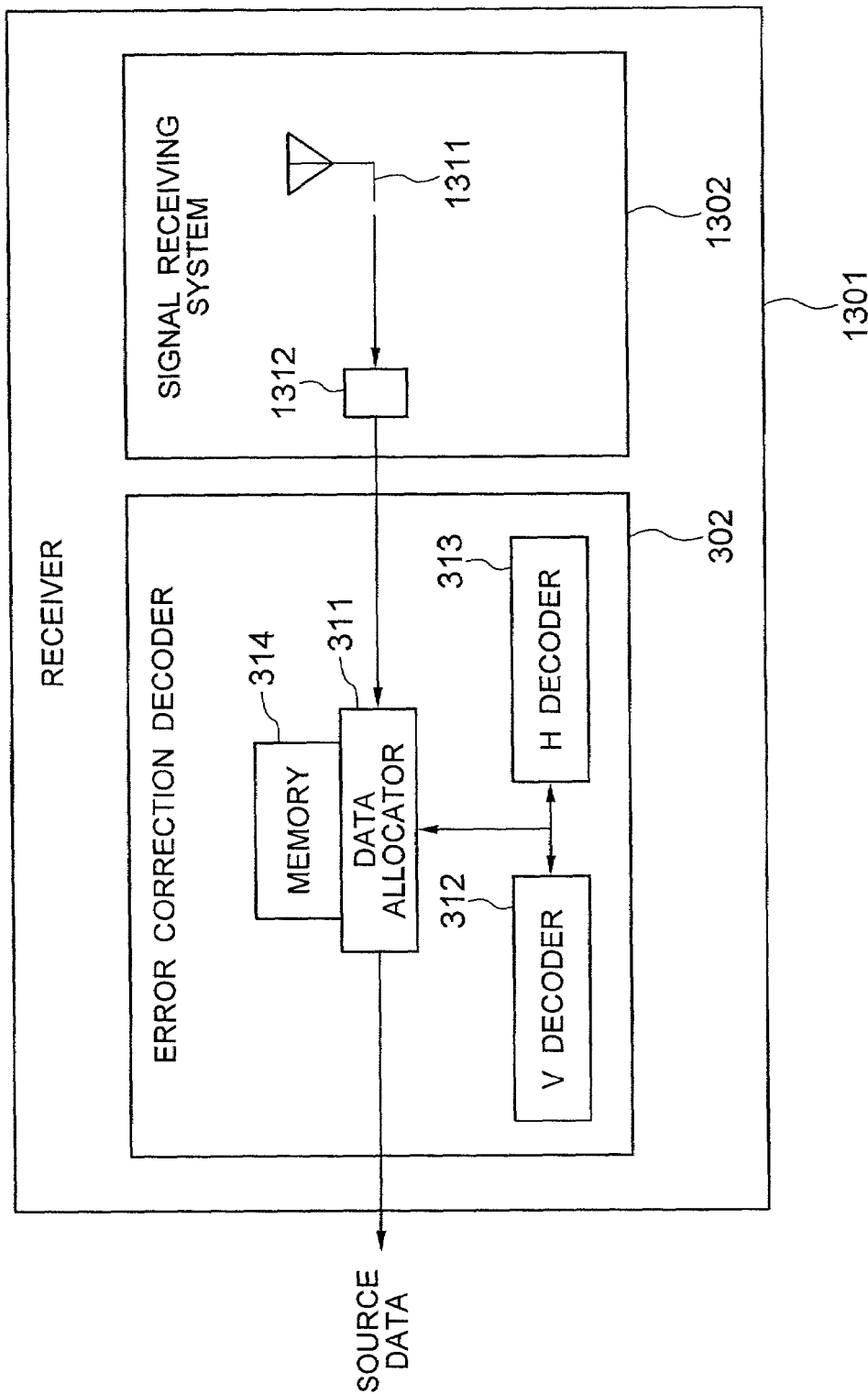
FIG. 13 is a block diagram showing an outline of constitution of a receiving apparatus using an error correction decoding device according to the present invention.

Description has been given of embodiments of the present invention using examples in which the present invention is applied to a storage using an optical disk. However, the present invention can also be applied to general storages such as a magnetic disk storage and a magnetic tape storage. Furthermore, the present invention can also be applied to a transmitting apparatus 1201 including a signal transmitting system including an antenna 1211 and a signal modulator 1212 and an error correction coding apparatus 202 as shown in FIG. 12, a receiving apparatus 1301 including a signal receiving system 1302 including an antenna 1311 and a signal demodulator 1312 and an error correction decoding apparatus 302 as shown in FIG. 13, and a cable communication apparatus using a transmission line. Additionally, according to the present invention, there can be provided an error correction coding and decoding apparatus having functions of the error correction coding apparatus and the error correction decoding apparatus, a recording and reproducing apparatus having functions of the recording apparatus and the reproducing apparatus in a storage, and a transmitting and receiving apparatus having functions of the transmitting apparatus and the receiving apparatus in a communicating apparatus.

Figure 14:
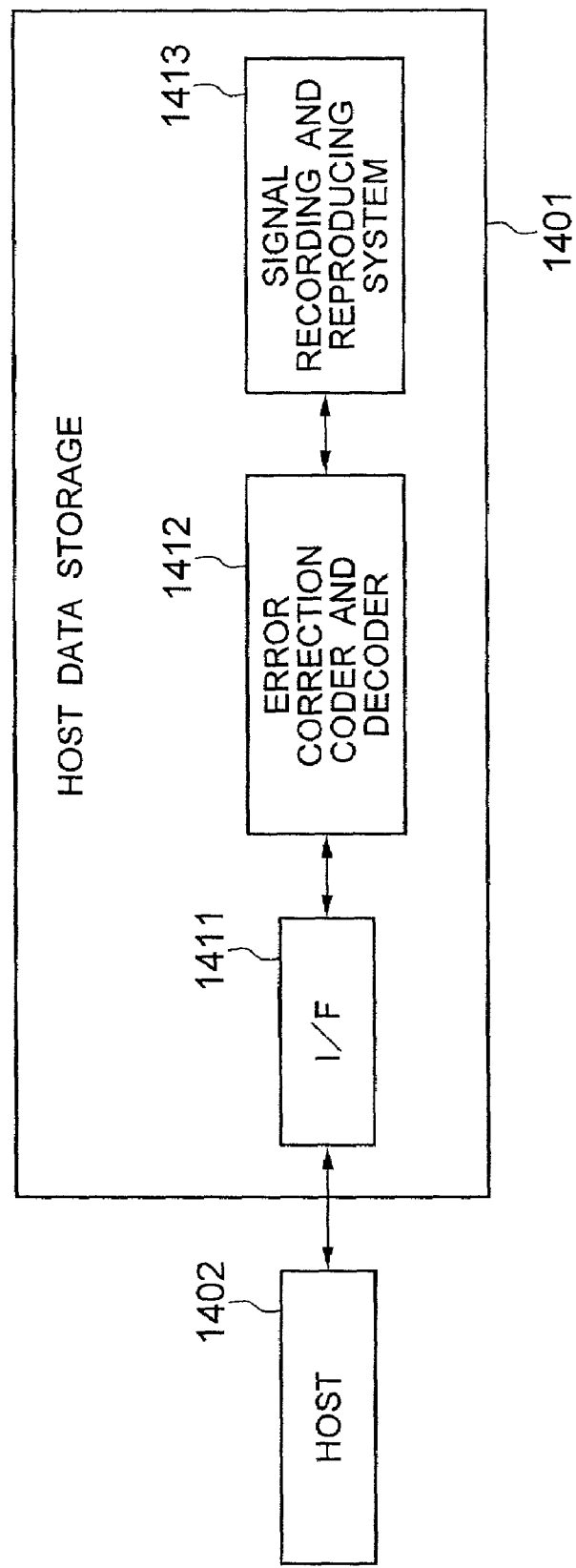
FIG. 14 is a block diagram showing an outline of constitution of a host data storage in an embodiment according to the present invention.

Specifically, the present invention can be applied, as shown in FIG. 14, to a host data storage 1401 generally used as an external memory of a computer. The host data storage 1401 includes an interface (I/F) 1411 to establish interface for a host 1402 via a cable or a connector, not shown, an error correction coding and encoding apparatus 1412 to generate and to decode an ECC block, and a signal recording and reproducing system 1413 to record and to reproduce a signal on a storing medium.

Figure 15:
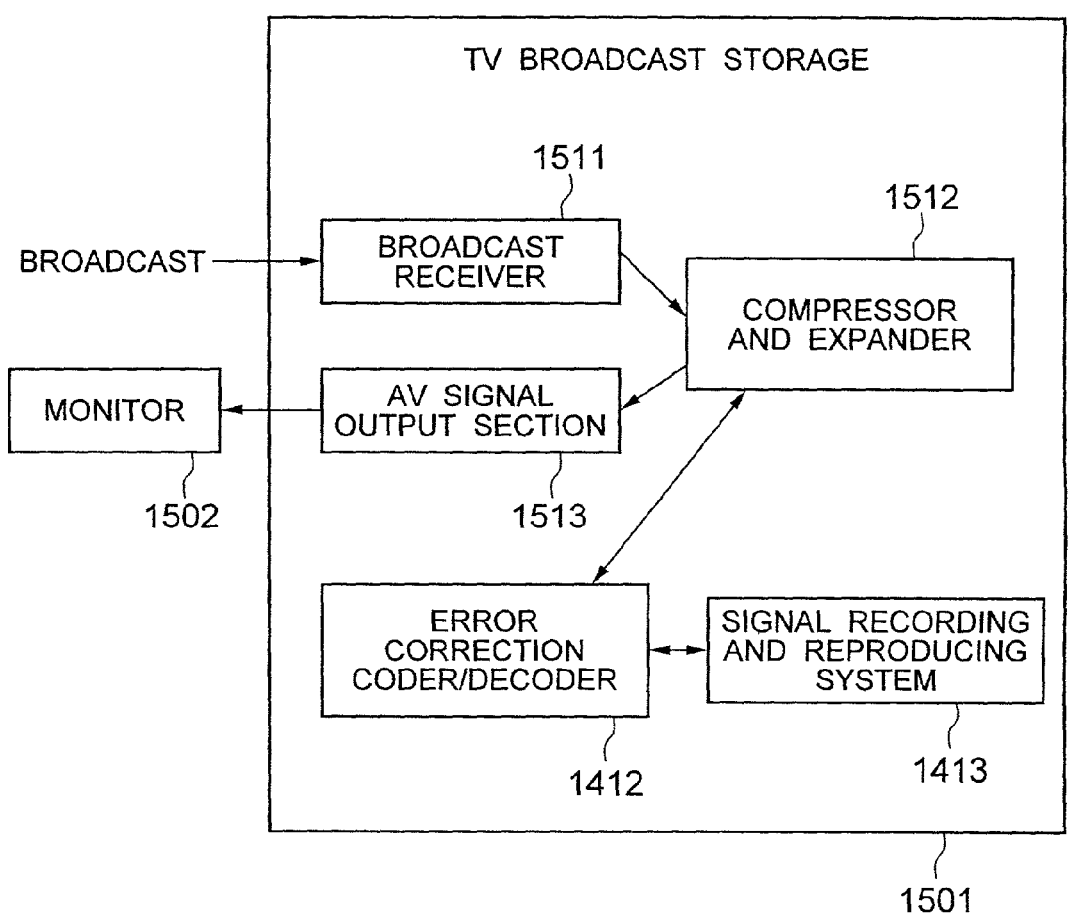
FIG. 15 is a block diagram showing an outline of constitution of a television broadcast storage in an embodiment according to the present invention.

Moreover, the present invention can be applied, as shown in FIG. 15, to a television broadcast storage 1501 including an error correction coding and decoding apparatus 1412, a signal recording and reproducing system 1413, a broadcast receiver 1511 which receive a television program signal to convert the signal into data of digital image data, image data compressing and expanding apparatus 1512 which compresses and expands digital image data, and an audio-visual (AV) signal output unit 1513 which converts digital image data into an AV signal and which sends the signal to a monitor 1502 via a cable or a connector, not shown.

Figure 16:
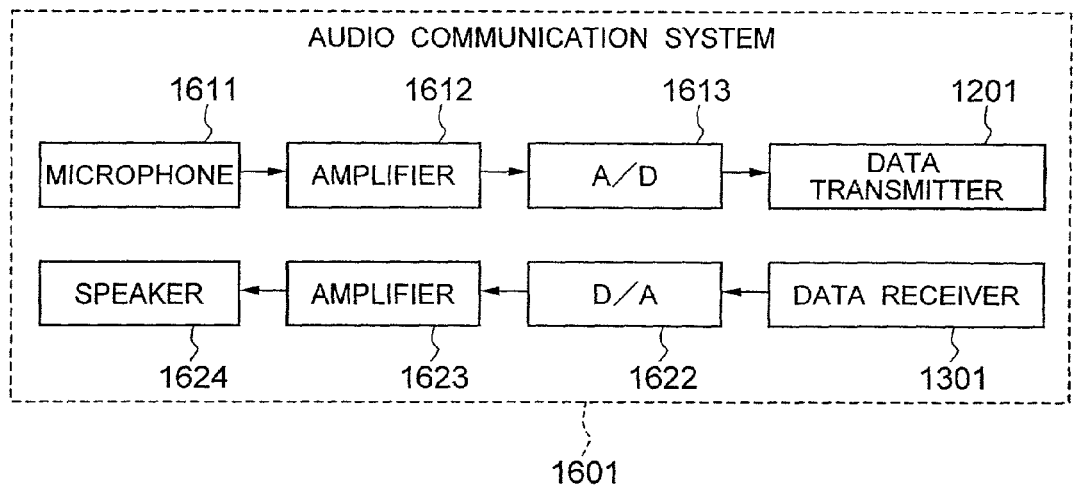
FIG. 16 is a block diagram showing an outline of constitution of an audio communication apparatus in an embodiment according to the present invention.
Figure 17:
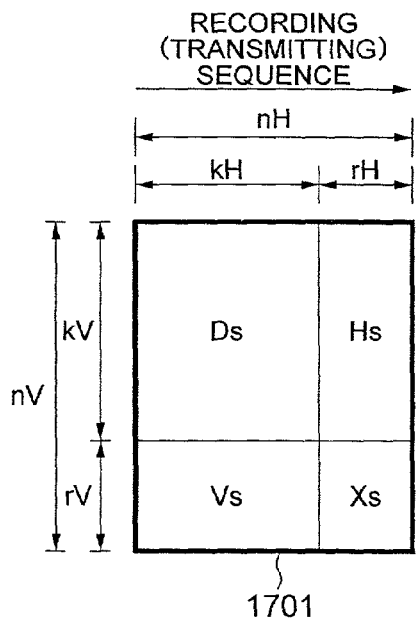
FIG. 17 is a diagram showing a concept of a data layout and a recording (transmitting) sequence of ECC block data for the error correction code obtained in a process to achieve the present invention.
Figure 18:
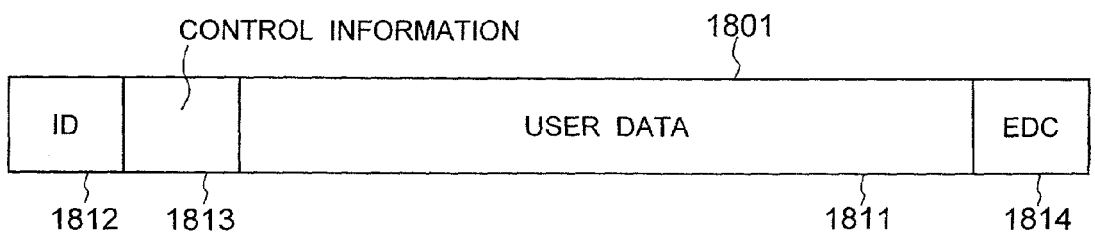
FIG. 18 is a diagram showing a data layout in a sector.

The present invention can also be applied, as shown in FIG. 16, to an audio communication system 1601 including a transmission system including a microphone 1611, an amplifier 1612, an analog-to-digital (A/D) converter 1613, and a transmitter 1201 in which voice is converted into a digital signal, the signal is coded using an error correction code, and the signal is sent to an external device. The audio communication system 1601 further includes a receiving system including a receiver 1301, a digital-to-analog converter 1622, an amplifier 1623, and a speaker 1624 in which an audio digital signal is received and is reproduced as sound. Furthermore, the present invention can also be applied to a portable video recording and reproducing apparatus including a lens, a light receiving section, a microphone, an amplifier, an audio-to-digital converter, a monitor, image data compressing and expanding device, and an error correction coding and decoding device.

It is to be understood that an ECC block which has the code rate similar to that of the product code and which has the maximum correctable burst error length larger than that of the product code can be coded/decoded. Even when data of a plurality of sectors is treated as one ECC block and there occur errors in which the ECC block cannot be corrected, data of several sectors included in the ECC block can be correctly reproduced. It is possible to code/decode an ECC block in which when an identifier there of is to be referred to, relatively short maximum latency is required before the identifier is referred to.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An error correction coding method for use with an error correction coding apparatus, comprising the steps of:
subdividing data which includes data of a plurality of sectors;
allocating the subdivided data in a plurality of arrangements of data;
coding each of said arrangements of data using a product code according to a code V and a code H and thereby generating a plurality of product-code codewords; and
outputting code-H codewords of each of said product-code codewords in a codeword-by-codeword manner in an alternating fashion for said plurality of product-code codewords,
wherein data of each sector lies on a plurality of said code-H codewords, and between the outputted data of each sector there does not exist data of another sector.

2. An error correction coding method according to claim 1, wherein the outputted data are stored in a storage.

3. An error correction coding apparatus, comprising:
means for subdividing data which includes data of a plurality of sectors;
means for allocating said subdivided data in a plurality of arrangements of data;
means for coding each of said arrangements of data using a product code according to a code V and a code H and thereby generating a plurality of product-code codewords; and
means for outputting code-H codewords of each of said product-code codewords in a codeword-by-codeword manner in an alternating fashion for said plurality of product-code codewords,
wherein data of each sector lies on a plurality of said code-H codewords, and between the outputted data of each sector there does not exist data of another sector.

4. An error correction coding apparatus according to claim 3, wherein the outputted data are stored in a storage.

5. An error correction decoding method for use with an error correction decoding apparatus comprising the steps of:
inputting data of code-H codewords with or without error data, in an order such that data of each sector lies on a plurality of said code-H codewords, and between the outputted data of each sector there does not exist data of another sector;
allocating said inputted data of code-H codewords in an arrangement of a plurality of product-code codewords according to a code V and a code H in a codeword-by-codeword manner in an alternating fashion for said plurality of product-code codewords with or without error data;
decoding said plurality of product-code codewords with said code V and said code H thereby to correct error data; and
providing data of said plurality of sectors from among said plurality of product-code codewords corrected.

6. An error correction decoding method according to claim 5, wherein the inputted data are read from a storage.

7. An error correction decoding apparatus comprising:
means for inputting data of code-H codewords with or without error data in an order such that data of each sector lies on a plurality of said code-H codewords, and between the outputted data of each sector there does not exist data of another sector;
means for allocating said inputted data of code-H codewords in an arrangement of a plurality of product-code codewords according to a code V and a code H in a codeword-by-codeword manner in an alternating fashion for said plurality of product-code codewords with or without error data;
means for decoding said plurality of product-code codewords with said code V and said code H thereby to correct error data; and
means for providing data of said plurality of sectors from among said plurality of product-code codewords corrected.

8. An error correction decoding apparatus according to claim 7, wherein the inputted data are read from a storage.

* * * * *